United States Patent Office 3,684,536

Patented Aug. 15, 1972

3,684,536

BISMUTHATE GLASS-CERAMIC PRECURSOR COMPOSITIONS

Lewis Charles Hoffman, Wilmington, Del., assignor to E. I. du Pont de Nemours and Company, Wilmington, Del.

No Drawing. Filed Nov. 4, 1970, Ser. No. 86,986

Int. Cl. C03c 3/04, 3/10, 5/02

U.S. Cl. 106—53 2 Claims

ABSTRACT OF THE DISCLOSURE

Bismuthate glass-ceramic precursors which are glass frit compositions and which are useful in forming printed circuit metallizations exhibiting excellent adhesion of metallization to ceramic substrate. Metallizing compositions for screen printing circuits onto ceramic substrates which consist essentially of, by weight, (a) 3–15% of a finely divided powder of such glass-ceramic precursors as a binder and (b) 85–97% of a finely divided noble metal powder. Dielectric ceramic substrates having printed and fired thereon such metallizing compositions.

BACKGROUND OF THE INVENTION

This invention relates to printed circuits, and, more specifically, relates to metallizing compositions for use in fabricating printed circuits on ceramic substrates.

Metallizing compositions for printing circuitry on ceramic substrates conventionally incorporate noble metals and inorganic binder material.

Previous attempts to make metallizing compositions which on firing exhibit good adhesion have generally involved employing as the binder a noncrystallizing glass mixed with free (non-dissolved) bismuth oxide. Typical of such art is Larsen and Short U.S. Pat. 2,822,279.

In the present invention, the problem of providing metallization which will exhibit improved adhesion to ceramic substrates has been solved by employing as the binder in these metallizations a glass composition which is a glass-ceramic precursor. The term "glass-ceramic" refers to a polycrystalline ceramic prepared by the controlled crystallization of a glass in situ. Some glass-ceramics are described in copending application Ser. No. 717,410, filed Mar. 29, 1968, now U.S. Pat. 3,586,522.

SUMMARY OF INVENTION

This invention relates to glass-ceramic precursors which are bismuthate glass frit compositions, useful as binders in forming printed circuit metallizations with excellent adhesion of metallization to ceramic substrate. The glass compositions consist essentially of, by weight:

| | Percent |
|---|---|
| $Bi_2O_3$ | 8–55 |
| $SiO_2$ | 6–20 |
| $TiO_2$ | 5–25 |
| BaO | 3–10 |
| $Al_2O_3$ | 3–15 |
| ZnO | 3–15 |
| PbO | 5–35 |
| $B_2O_3$ | 0–15 |

This invention also provides metallizing compositions for screen printing circuits on ceramic substrates, which metallizing compositions consist essentially of, by weight, (a) 3–15% of a finely divided powder of the glass-ceramic precursor mentioned above, as a binder, and (b) 85–97% of a finely divided noble metal powder. These metallizing compositions are optionally dispersed in an inert vehicle prior to printing upon the ceramic substrate. This invention also provides dielectric ceramic substrates having printed and fired thereon such metallizing compositions, to form electrically conductive films.

DETAILED DESCRIPTION

The metallizing compositions of this invention exploit various ingredients in a critical combination of proportions such that the metallizing compositions possess highly desirable properties in producing printed circuits with excellent metallization to ceramic substrate adhesion. More particularly, the compositions comprise certain critical proportions of noble metal to glass.

The ingredients of the glass composition, which is a glass-ceramic precursor, must be present within the composition ranges (expressed in weight percentages) as stated in Table I and may be present in the preferred ranges stated therein.

TABLE I

[Weight percent]

| | Operable proportion | Preferred proportion |
|---|---|---|
| Component: | | |
| $Bi_2O_3$ | 8–55 | 10–40 |
| $SiO_2$ | 6–20 | 7–18 |
| $TiO_2$ | 5–25 | 6–21 |
| BaO | 3–10 | 4–8 |
| $Al_2O_3$ | 3–15 | 3–11 |
| ZnO | 3–15 | 5–13 |
| PbO | 5–35 | 7–32 |
| $B_2O_3$ | 0–15 | 0–10 |

A physical mixture of the above metal oxides forms stable bismuthate glasses when quenched from the molten state, which stable glasses are the glass-ceramic precursors of the present invention. When the glasses are finely ground, optionally dispersed in an inert vehicle, printed and then fired as films on substrates, the nucleation and crystallization of the glass to form a glass-ceramic are carried out in a single step, at the same firing temperature and, consequently, much more rapidly than with conventional crystallizing glasses. Once the instant glass-ceramic precursors softens and is held at the firing temperature for a sufficient period of time to crystallize, it becomes a non-thermoplastic glass-ceramic.

In making the glass-ceramic precursors of the present invention, there are employed certain critical proportions of glass formers and modifiers, plus a substantial proportion of bismuth oxide. The bismuth oxide, glass formers and glass modifiers are melted together and quenched in water (fritted) for friability.

The glass-ceramic in the fired metallization of the present invention contains a crystalline phase comprising up to 40% by weight of the total glass-ceramic phase. The crystals formed on firing have the molar compositions $BaAl_2Si_2O_8$ and $Al_2TiO_5$. The major crystalline phase, $BaAl_2Si_2O_8$ (hexacelsian), has been identified by X-ray diffraction patterns and is a feldspar of cubic symmetry. The above crystals have extremely low thermal expansion and, when produced in a matrix of glass of higher expansion, exert compression forces on the surrounding matrix. On cooling, this effect, which may be referred to as "internal tempering,'" produces the high tensile strength which is responsible for the good adhesion exhibited by the fired metallizing compositions of the present invention.

The role in the glass-ceramics of the constituents of the glass-ceramic precursors (glass compositions) of the present invention is as follows. Bismuth oxide contributes preferential wetting of the ceramic substrate. Barium oxide, alumina and silica are three of the essential ingredients in the composition, in that they form the hexacelsian crystals mentioned above.

Titania is the nucleating agent and the amount utilized greatly affects the crystalline content of the fired glass-ceramic. Therefore, the presence of titania and the amount of titania used in critical in the present invention.

Lead oxide is essential as a flux and is the only flux present, unless optional $B_2O_3$ is added. Zinc oxide is a modifier which achieves overall balance of desirable properties.

The presence of the various constituents in the glass-ceramic precursors was discussed above. Their proportions in the glass-ceramic precursors will now be discussed. Bismuth oxide should be 8–55% of the glass-ceramic precursor. Smalled amounts of bismuth oxide are less effective in wetting of the substrate to produce the excellent adhesion as in the present invention. Higher amounts of bismuth oxide raise the thermal expansion of the material so high as to produce cracking in the fired product. The preferred range of bismuth oxide is 10–40%.

The glass-ceramic precursor composition should contain 5–25% (preferably, 6–21%) of titanium dioxide. The glass-ceramic precursor must contain at least 5% by weight of titanium dioxide since amounts less than this do not cause sufficient crystallization in the compositions of the present invention to produce useful glass-ceramics. At a titanium dioxide concentration of less than 5%, sufficiently rapid crystallization to produce useful adhesion does not occur. Amounts of titanium dioxide greater than 25% often lead to porosity and low strength in the metallizing layers. More than 20% titanium dioxide may be harmful because of the resultant porosity.

The amount of silicon dioxide in the glass-ceramic precursor is 6–20%, preferably 7–18%. Amounts of silicon dioxide less than 6% lead to high expansion, and amounts of silicon dioxide greater than 20% require excessively high firing temperature.

Alumina must be present in the range 3–15%, preferably 3–11%, of the glass-ceramic precursor composition. Less than 3% alumina inhibits crystallization. When larger amounts of alumina are incorporated, the glass-ceramic becomes too refractory.

Due to its critical role in the crystalline hexacelsian phase, barium oxide must be present in amounts of 3–10% of the glass-ceramic composition, preferably 4–8%. Use of more than 10% barium oxide in combination with the other components in the present invention leads to excessive porosity, because it ends up in the "free state" and has a high melting point.

Zinc oxide and lead oxide are modifiers, and their presence is essential for overall balance of good properties in the present invention. Their concentrations can be varied over somewhat wider proportions than with the preceding components without producing a drastic change in ultimate properties. Lead oxide should be present in amounts ranging from 5–35%, preferably 7–32%, of the glass-ceramic precursor; and zinc oxide in amounts in the range 3–15%, preferably 5–13%.

Boric oxide may optionally be present in amounts up to 15%, and is preferably present in amounts up to 10%, in the glass-ceramic precursors. The function of boric oxide is to provide low firing temperature without drastic increase in thermal expansion. However, larger amounts of boric oxide cause excessive increases in thermal expansion. Unlike the situation in the compositions of Ser. No. 717,410, the presence of boric oxide in the range cited above does not interfere with the function of the present invention, i.e., high adhesion metallizations, whereas in Ser. No. 717,410 boric oxide harms the electrical properties of screen-printable crossover dielectrics.

It should be understood that there are other common glass constituents which can be used in making the glass ceramics of the present invention, and which do not introduce strong adverse effects. Illustrative of these are BeO, MgO, CaO, SrO, $La_2O_3$, $Cr_2O_3$, MnO, $Fe_2O_3$, CuO, $P_2O_5$, $As_2O_3$, $Sb_2O_3$, and the rare earth oxides.

The glass-ceramic precursors of the present invention are prepared from suitable batch compositions of oxides or oxide precursors by melting any suitable batch composition which yields the prescribed metal oxides in the prescribed proportions. Metal oxides in the prescribed proportions form stable glasses when quenched from the molten state, to produce the glass-ceramic precursors. A physical mixture of metal oxides or oxide precursors such as metal hydroxides or carbonates may be employed. The batch composition to be utilized in preparing glass-ceramic precursors is first mixed and then melted to yield a substantially homogeneous fluid glass. The temperature maintained during this melting step is not critical, but is usually within the range 1100–1650° C., so that rapid homogenation of the melt can be obtained. A temperature of about 1450° C. is preferred. After a homogeneous fluid glass is obtained, it is generally poured into water or other liquid to form a frit.

The glass-ceramic precursors as used in the metallizing compositions of the present invention are in finely divided form. The frit of glass-ceramic precursor is, therefor, finely ground in a conventional ball mill prior to its use in these metallizing compositions. Glass-ceramic precursor powders having an average particle size not exceeding 50 microns in diameter are generally suitable, but those having average particle sizes of 1–15 microns are distinctly preferred. Generally, no particles in this preferred particle size should exceed 44 microns, that is, the particles should pass through a 325-mesh screen (U.S. standard sieve scale).

The conductive metals used in the metallizing compositions of the present invention are noble metal powders. Preferred noble metal powders are silver, gold, mixtures of platinum and gold, of palladium and silver, or of palladium and gold (proportions are prescribed below).

It is important for the production of printed circuits that the particle size of the noble metal powder not be too large. It is preferred that the particle size of the noble metal powders not exceed 40 microns. Generally, noble metal powders with an average particle size in the range 0.01–10 microns are employed.

The proportions of glass-ceramic precursor and noble metal powder in the metallizing compositions of the present invention are a critical part of the present invention. Those proportions are expressed in terms of weight percentage of the solids (noble metal *and* glass-ceramic precursor) in the metallizing composition. The metallizing compositions of the present invention consist essentially of (a) 3–15% of a finely divided powder of the glass-ceramic precursor as a binder and (b) 85–97% of a finely divided noble metal powder. Several preferred embodiments of the noble metal powder are as follows. The noble metal powder may be gold or silver. In another embodiment, the 85–97% noble metal powder comprises 50–97% silver.

In another preferred embodiment, the 85–97% noble metal powder is, complementally (I) 17–32% platinum and 60–75% gold, or (II) 30–35% palladium and 55–62% silver, or (III) 5–30% palladium and 55–80% gold, said proportions being expressed as the percentage of the total metal/glass frit composition.

The optimum amount of glass-ceramic precursor in the metallizing composition of this invention is 6–10%, in which event the amount of noble metal is 90–94%.

The noble metal and glass-ceramic precursor powders are formulated into the metallizing compositions of the present invention in the following manner. Finely divided glass-ceramic powder and finely divided noble metal powder are thoroughly mixed mechanically. In those instances where more than one noble metal powder is employed, mixtures are prepared directly from the individual powders. For example, platinum golds are formulated from mixtures of gold powder, platinum powder and glass-ceramic precursor powder. In some instances (for example, in the case of platinum golds) it may be desirable to add excess bismuth trioxide to the mixture of gold powder, platinum powder and glass-ceramic precursor.

The metallizing compositions of the present invention are printed as a film onto ceramic dielectric substrates in the conventional manner. Generally, screen stenciling techniques are preferably employed. The metallizing composition may be printed either dry or in the form of a dispersion in an inert liquid vehicle.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetate and propionates; terpenes such as pine oil, α- and β-terpineol and the like; solutions of resins such as the polymethacrylates of lower alcohols, or solutions of ethylcellulose, in solvents such as pine oil and the monobutyl ether of ethylene glycol monoacetate. The vehicle may contain or be composed of volatile liquids to promote fast setting after application to the substrate. Alternately, the vehicle may contain waxes, thermoplastic resins or like materials which are thermofluids, so that the vehicle containing metallizing composition may be applied at an elevated temperature to a relatively cold ceramic body upon which the metallizing composition sets immediately.

The ratio of inert vehicle to solids (glass-ceramic precursor and metal) in the metallizing compositions of this invention may vary considerably and depends upon the manner in which the dispersion of metallizing composition in vehicle is to be applied and the kind of vehicle used. Generally, from 1 to 20 parts by weight of solids per part by weight of vehicle will be used to produce a dispersion of the desired consistency. Preferably, 4–10 parts of solid per part of vehicle will be used.

As indicated above, the metallizing compositions of the present invention are printed onto ceramic substrates, after which the printed substrate is fired to mature the metallizing compositions of the present invention, thereby forming continuous conductors. The glass-ceramic precursor component of the metallizing composition of the prise finely divided noble metal powders and a fine powder of said glass-ceramic precursors. It is possible to depart somewhat from the specific examples tabulated, present invention upon firing produces the glass-ceramic referred to above. Generally, the printed substrate is fired in the temperature range 600–1100° C. to mature the glass-ceramic precursor into the glass-ceramic. Preferably, the firing is conducted at 800–1000° C., typically for 5–10 minutes at peak temperatures. This firing step is a very important process step in securing the glass-ceramic of the present invention. The firing temperature selected for a particular glass-ceramic precursor in the metallizing composition is a temperature where differential thermal analysis shows the maximum crystallization rate to occur. Conventional differential thermal analysis procedures and determinations are disclosed by W. J. Smothers, "Differential Thermal Analysis," Chemical Publishing, New York, 1958. It is important that the nucleation and crystallization to form the glass ceramic be carried out in a single step, at the same firing temperature, to form a glass-ceramic within a short period of time. Such a short period of time is often 1 minute. As the firing is carried out, crystals form and grow until the glass-ceramic film is opaque. By following this procedure, the glass-ceramic products of this invention contain less than 40% crystalline phase as fine particles dispersed throughout a glassy matrix. It is felt that the finely divided nature of the metallizing compositions of the present invention results in more rapid crystallization kinetics, because the process is surface nucleated.

Generally, in practicing the present invention, the batch mixtures given in Table II, or any other suitable batch compositions, may be employed to produce glass-ceramic precursors (glass compositions) such as those of Table III, which may then be utilized to produce screen-printable metallizing compositions which comprovided that the compositions so produced have constituents present within the weight percentages given.

The present invention is illustrated by the following examples. In the examples and elsewhere in the specification, all parts, ratios, and percentages of materials or componnts are by weight.

EXAMPLES 1–12

Glass-ceramic precursor compositions of Table III were prepared in frit form from the respective batch compositions (1–12) of Table II by introducing the oxide either as oxide, carbonate or hydroxide. $Bi_2O_3$, $SiO_2$, $TiO_2$, ZnO and PbO were introduced as oxides, BaO as $BaCO_3$, $Al_2O_3$ as $Al(OH)_3$ and $B_2O_3$ as $H_3BO_3$.

The dry batch components were weighed out, thoroughly mixed and introduced into a kyanite (aluminum silicate) crucible. Crucible and contents were placed in an electric furnace at 1450° C. until all gas evolution ceased and the contents were clear and transparent. Crucible and contents were removed from the furnace and the contents slowly poured into cold water. The frit formed by this process was placed in a ball mill jar equipped with the normal complement (50 volume percent) of grinding medium (ceramic balls) and the proper weight of water (about 8 to 30% by weight of the solids to be ground) and ground until less than 1% residue was retained on a 325-mesh sieve (U.S. standard mesh). Normally, it takes 16 hours for a 1500-gram charge in a one-gallon ball mill with 120 cc. of water to be properly ground. The slurry was vacuum filtered on Whatman No. 1 paper; the solid product was dried at 105° C. for 16 hours; the dried cake was then micropulverized to break up the drying aggregates. These finely divided glass-ceramic precursor compositions are used to prepare metallizing compositions, which are printed and fired on dielectric ceramic substances to produce metallizations which exhibit excellent adhesion to the substrate.

TABLE II.—BATCH COMPOSITIONS

[Weight percent]

| Component | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $Bi_2O_3$, bismuth oxide | 30.7 | 30.7 | 30.7 | 30.7 | 30.7 | 30.7 | 30.7 | 30.7 | 48 | 36.1 | 9.3 | 18.5 |
| $SiO_2$, flint | 12.2 | 6.8 | 9.5 | 12.2 | 12.2 | 12.2 | 12 2 | 12.2 | 13 | 12.2 | 15.7 | 15.7 |
| $TiO_2$, titania | 16.2 | 18.9 | 13.5 | 13.5 | 10.8 | 10.8 | 10.8 | 10.8 | 5.8 | 5.4 | 11.1 | 11.1 |
| ZnO, zinc oxide | 6.3 | 9.0 | 11.7 | 11.7 | 6.3 | 8.1 | 9.9 | 11.7 | 4.8 | 4.5 | 9.3 | 9.3 |
| PbO, litharge | 9.0 | 9.0 | 9.0 | 6.3 | 14.4 | 12.6 | 10.8 | 9.0 | 15.4 | 16.2 | 26.6 | 20.4 |
| $BaCO_3$ barium carbonate | 4.7 | 4.7 | 4.7 | 4.7 | 4.7 | 4.7 | 4.7 | 4.7 | 5.0 | 4.7 | 9.5 | 9.5 |
| Al $(OH)_3$ alimunim hydrate | 4.9 | 4.9 | 4.9 | 4.9 | 4.9 | 4.9 | 4.9 | 4.9 | 8.0 | 4.9 | 15.5 | 15.5 |
| $H_3BO_3$, boric acid | 16.0 | 16.0 | 16.0 | 16.0 | 16.0 | 16.0 | 16.0 | 16.0 | ------ | 16.0 | ------ | ------ |

TABLE III.—GLASS-CERAMIC PRECURSORS (GLASS COMPOSITIONS)

[Weight percent]

| Component | Example 1 | 2 | 3 | 4 | 5 | 6 | 7 | 8 | 9 | 10 | 11 | 12 |
|---|---|---|---|---|---|---|---|---|---|---|---|---|
| $Bi_2O_3$ | 34.0 | 34.0 | 34.0 | 34.0 | 34.0 | 34.0 | 34.0 | 34.0 | 50.0 | 40.0 | 10.0 | 20.0 |
| $SiO_2$ | 13.5 | 7.5 | 10.5 | 13.5 | 13.5 | 13.5 | 13.5 | 13.5 | 13.5 | 13.5 | 17.0 | 17.0 |
| $TiO_2$ | 18.0 | 21.0 | 15.0 | 15.0 | 12.0 | 12.0 | 12.0 | 12.0 | 6.0 | 6.0 | 12.0 | 12.0 |
| BaO | 4.0 | 4.0 | 4.0 | 4.0 | 4.0 | 4.0 | 4.0 | 4.0 | 4.0 | 4.0 | 8.0 | 8.0 |
| $Al_2O_3$ | 3.5 | 3.5 | 3.5 | 3.5 | 3.5 | 3.5 | 3.5 | 3.5 | 5.5 | 3.5 | 11.0 | 11.0 |
| ZnO | 7.0 | 10.0 | 13.0 | 13.0 | 7.0 | 9.0 | 11.0 | 13.0 | 5.0 | 5.0 | 10.0 | 10.0 |
| PbO | 10.0 | 10.0 | 10.0 | 7.0 | 16.0 | 14.0 | 12.0 | 10.0 | 16.0 | 18.0 | 32.0 | 22.0 |
| $B_2O_3$ | 10.0 | 10.0 | 10.0 | 10.0 | 10.0 | 10.0 | 10.0 | 10.0 | | 10.0 | | |

EXAMPLES 13–21

Metallizing compositions having the specific compositions listed in Table IV were prepared and fired on substrates and adhesion was then tested, as described below. In Examples 13–21, frits (glass-ceramic precursors) prepared as in Examples 1, 6 or 7 of Table III were employed. In Examples 13–21, the indicated metallizing compositions were printed on substrates employing a composition containing ethylcellulose and β-terpineol as the vehicle. The weight ratio of metallizing composition to vehicle was 2.5 to 1. The printed substrates were then dried in an oven at 105° C. for 10 minutes. The dried substrates were fired in a belt furnace (120 inches long) to peak temperatures of between 850–1000° C. at belt speeds of 2 to 3 inches per minute. The particular peak temperature used (and the time at peak temperature) with each of Examples 13–21 is indicated in Table V. Lead wires were then soldered onto standard 1/10 inch by 1/10 inch pads with No. 24 pretinned copper wire. These leads were pulled off at right angles to the pad with a strain gauge type of tester and the stress to failure determined. Stress to failure results for each of Example 13–21 are recorded in Table V.

These glass-ceramic bound conductors according to the present invention show much improved adhesion over prior conductors in which the binder was a noncrystallizing glass mixed with free bismuth oxide.

TABLE IV.—METALLIZING COMPOSITIONS

[Weight percentage]

| Component | Example 13 | 14 | 15 | 16 | 17 | 18 | 19 | 20 | 21 |
|---|---|---|---|---|---|---|---|---|---|
| Platinum | 31.0 | 30.5 | 30.0 | 27.0 | 19.0 | | | | |
| Gold | 63.0 | 61.5 | 60.0 | 63.0 | 73.0 | | | | |
| Palladium | | | | | | 31.8 | 31.8 | 33.6 | 31.0 |
| Silver | | | | | | 58.2 | 58.2 | 61.4 | 56.5 |
| Frit: | | | | | | | | | |
| 1 | 6.0 | 8.0 | 10.0 | 10.0 | 8.0 | | | | 12.5 |
| 6 | | | | | | 10.0 | | | |
| 7 | | | | | | | 10.0 | 5.0 | |

TABLE V

| Example | Peak furnace temperature (° C.) | Time at peak temperature (min.) | Stress to failure (pounds/inch) |
|---|---|---|---|
| 13 | 1,000 | 10 | 20 |
| 14 | 1,000 | 10 | 30 |
| 15 | 1,000 | 10 | 38 |
| 16 | 950 | 10 | 42 |
| 17 | 950 | 10 | 34 |
| 18 | 850 | 5 | >50 |
| 19 | 850 | 5 | >50 |
| 20 | 850 | 5 | >50 |
| 21 | 850 | 5 | >50 |

What is claimed is:

1. Glass-ceramic precursors which are glass frit compositions and which are useful in forming printed circuit metallizations exhibiting good adhesion of metallization to ceramic substrate, said glass compositions consisting essentially of, by weight:

| | Percent |
|---|---|
| $Bi_2O_3$ | 8–55 |
| $SiO_2$ | 6–20 |
| $TiO_2$ | 5–25 |
| BaO | 3–10 |
| $Al_2O_3$ | 3–15 |
| ZnO | 3–15 |
| PbO | 5–35 |
| $B_2O_3$ | 0–15 |

2. Glass-ceramic precursors according to claim 1 consisting essentially of, by weight:

| | Percent |
|---|---|
| $Bi_2O_3$ | 10–40 |
| $SiO_2$ | 7–18 |
| $TiO_2$ | 6–21 |
| BaO | 4–8 |
| $Al_2O_3$ | 3–11 |
| ZnO | 5–13 |
| PbO | 7–32 |
| $B_2O_3$ | 0–10 |

References Cited

UNITED STATES PATENTS

| | | | |
|---|---|---|---|
| 3,437,892 | 4/1969 | Hoffman | 106—49 |
| 3,470,002 | 9/1969 | Marcello et al. | 106—49 |
| 3,586,522 | 6/1971 | Hoffman | 106—53 |

TOBIAS E. LEVOW, Primary Examiner

M. L. BELL, Assistant Examiner

U.S. Cl. X.R.

106—39 DV, 49; 117—201; 252—514